(12) United States Patent
Evstratov (10) Patent No.: US 7,724,095 B2
(45) Date of Patent: May 25, 2010

(54) FLOATING DC-OFFSET CIRCUIT FOR PHASE DETECTOR

(76) Inventor: Leonid V. Evstratov, 27 Savita Road, Brampton, Ontario (CA) L7A 3V1

( * ) Notice: Subject to any disclaimer, the term of this patent is extended or adjusted under 35 U.S.C. 154(b) by 20 days.

(21) Appl. No.: 11/949,985

(22) Filed: Dec. 4, 2007

(65) Prior Publication Data

US 2008/0129355 A1    Jun. 5, 2008

Related U.S. Application Data

(60) Provisional application No. 60/872,477, filed on Dec. 4, 2006.

(51) Int. Cl.
*H03L 7/085* (2006.01)
(52) U.S. Cl. .................. 331/25; 331/16; 327/5
(58) Field of Classification Search .............. 331/16, 331/18, 25, 26, 1 A, 44, 179; 327/2, 3, 5, 327/7, 12, 156, 157, 159
See application file for complete search history.

(56) References Cited

U.S. PATENT DOCUMENTS

| | | | |
|---|---|---|---|
| 3,882,412 A | 5/1975 | Apple, Jr. | |
| 4,937,537 A | 6/1990 | Nyqvist | |
| 5,382,922 A * | 1/1995 | Gersbach et al. | 331/1 A |
| 5,719,908 A * | 2/1998 | Greeff et al. | 375/376 |
| 6,583,675 B2 * | 6/2003 | Gomez | 331/17 |
| 7,230,505 B2 * | 6/2007 | Rachedine et al. | 331/179 |
| 2004/0000956 A1 * | 1/2004 | Jaehne et al. | 331/16 |

OTHER PUBLICATIONS

International Search Report as received on the corresponding PCT application No. PCT/CA2007/002156, issued on Apr. 21, 2008.

* cited by examiner

*Primary Examiner*—Robert Pascal
*Assistant Examiner*—Ryan J Johnson
(74) *Attorney, Agent, or Firm*—Bereskin and Parr LLPS/S.E.N.C.R.L., s.r.l.

(57) ABSTRACT

A floating DC-offset circuit for a phase detector. The circuit may provide a floating DC-offset to the phase detector, or to the voltage-controlled oscillator of the phase-locked loop. The circuit includes a voltage comparator, clock, digital resistor, and offset line to a DC-offset branch of the phase detector. The voltage comparator detects when the voltage at the output of the loop filter of the phase-locked loop has gone outside of a designated range, and activates the clock when the voltage is outside the designated range. The clock emits impulses that are counted by the digital resistor. The digital resistor shifts DC-offset at the DC-offset branch of the phase detector. The new DC-offset level is maintained once the loop filter output voltage has returned within the designated range. In an alternate embodiment, the DC-offset branch is connected to rough-tuning input of a wide-tuned voltage-controlled oscillator.

7 Claims, 9 Drawing Sheets

FIG.1

PRIOR ART

FLOATING DC-OFFSET CIRCUIT FOR PHASE DETECTOR

This is an application claiming the benefit under 35 USC 119(e) of U.S. Provisional Patent Application Ser. No. 60/872,477 filed Dec. 4, 2006. U.S. Ser. No. 60/872,477 is incorporated herein, in its entirety, by this reference to it.

FIELD OF THE INVENTION

This invention relates to a floating DC-offset circuit for a phase detector, and more specifically, to a floating DC-offset circuit for use with a phase detector in a phase-locked loop.

BACKGROUND OF THE INVENTION

A phase-locked loop functions as a feedback control loop that detects a reference frequency signal, and generates and outputs a signal with a frequency and phase related to an input reference frequency signal. The negative feedback maintains the output signal locked to the reference signal, or, acts to bring the output signal into the same frequency and phase as the reference signal and then locks the output to the reference signal. The many applications of a phase-locked loop include stabilizing a signal, generating an analog signal with the same frequency as the input signal, signal demodulation, and the detection of a signal in the presence of noise.

Phase-locked loops are widely used in radio, telecommunications, computers, and a large range of other electronics systems. However, one limitation of phase-locked loops is the tendency for each component to exhibit drift when the phase-locked loop experiences temperature change, frequency level changes, changes in power, or other environmental shifts. The effect of drift in the components of the circuit, if the drift becomes significantly large, may be to jointly offset the average frequency of the oscillator in the phase-locked loop to the extent that it becomes difficult for the loop to become, or remain, locked to the reference frequency.

Solutions to this problem have been described in the prior art, including inversing the temperature drifts of the blocks of the circuit, introducing the desired offset voltage to the circuit, and inverting the DC into an AC phase difference. These solutions are limited by practical factors, such as the difficulty of matching inverse temperature drifts of the circuit blocks, and by cost factors, such as the cost of inverting DC into AC phase difference.

Accordingly, there is a need for a phase-locked loop that can adapt to extreme temperature, frequency, and power changes, as well as other environmental changes, while remaining able to in maintain, or achieve, a locked state with a reference frequency.

SUMMARY OF THE INVENTION

The invention provides in one aspect, a floating DC-offset circuit connecting to the components of a standard phase-locked loop circuit, the phase-locked loop comprising:
 (a) a phase detector;
 (b) a loop filter; and
 (c) a voltage-controlled oscillator,
 (d) wherein the phase detector, loop filter and voltage-controlled oscillator are connected in series in a loop configuration,
The floating DC-offset circuit comprising:
 (a) a voltage comparator electronically connected to the output of the loop filter;
 (b) a clock connected to an output of the voltage comparator; and,
 (c) a digital resistor attached by its output to a DC-offset branch of the phase detector.

The invention provides in another aspect a method of applying a floating DC-offset to a phase-locked loop, comprising the steps of:
 (a) setting a designated range at a voltage comparator, the voltage comparator being connected to the output of the loop filter, the designated range having an upper limit lower than the highest voltage at the output of the loop filter, the lower limit higher than the lowest voltage at the output of the loop filter;
 (b) setting the voltage comparator to output one of three signals, the signals being: loop filter output voltage is above the designated range, loop filter output voltage is below the designated range, and loop filter output voltage is within the designated range;
 (c) detecting the output signal of the voltage comparator at a clock;
 (d) activating the clock if the voltage comparator outputs a signal that the loop filter output voltage is above or below the designated range;
 (e) detecting, at a digital resistor, clock pulses from an output of the clock, detecting a direction signal from the voltage comparator, and shifting the DC-offset at the phase detector in the phase-locked loop according to the direction signal from voltage comparator;
 (f) deactivating the clock when the voltage comparator indicates that the output voltage is within the designated range; and
 (i) maintaining the new DC-offset value at the phase detector when the clock stops.

The invention provides in another aspect a method of applying a floating DC-offset to a phase-locked loop, comprising the steps of:
 (a) setting a designated range at a voltage comparator, the voltage comparator being connected to the output of the loop filter, the designated range being a narrow range of the voltage range of the voltage-controlled oscillator;
 (b) setting the voltage comparator to output one of three signals, the signals being: loop filter output voltage is above the designated range, loop filter output voltage is below the designated range, and loop filter output voltage is within the designated range;
 (c) detecting the output signal of the voltage comparator at a clock;
 (d) activating the clock if the voltage comparator emits a signal that the loop filter output voltage is above or below the designated range;
 (e) detecting, at a digital resistor, clock pulses from an output of the clock, detecting a direction signal from the voltage comparator, and shifting the DC-offset at a second input of the voltage-controlled oscillator according to the direction signal from voltage comparator;
 (f) deactivating the clock when the voltage comparator indicates that the output voltage is within the designated range; and
 (g) maintaining the new DC-offset value at the phase detector when the clock stops.

Further aspects and advantages of the invention will appear from the following description taken together with the accompanying drawings.

DETAILED DESCRIPTION OF THE INVENTION

Figure 1:
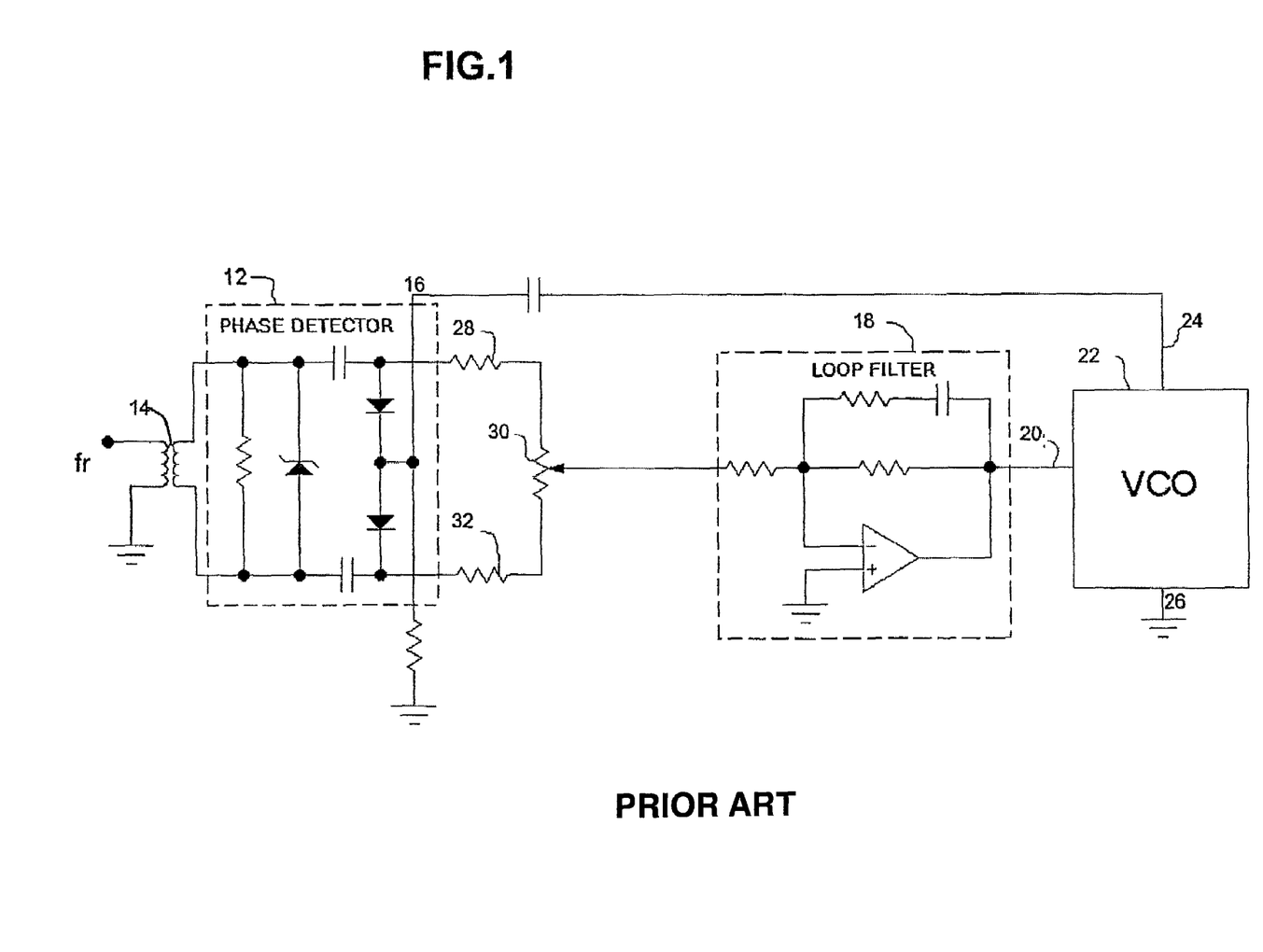
FIG. 1 is a circuit diagram of a prior art phase-locked loop.

FIG. 1 shows a circuit diagram of a prior art phase-locked loop. The phase-locked loop comprises a phase detector 12, having a reference frequency input 14 and a feedback frequency input 16, a loop filter 18 coupled to the phase detector 12, and a feedback branch, which includes a loop filter output line 20 connecting the loop filter 18 to a voltage-controlled oscillator (VCO) 22, which is coupled to the phase detector 12 by a VCO feedback output line 24. The VCO feedback output line 24 is coupled to the feedback frequency input 16 of the phase detector 12. The VCO also has a connection to ground 26.

The VCO 22 produces an AC signal at a frequency that is a function of the input voltage at the loop filter output line 20. This AC signal is transmitted through the feedback output line 24 leading to the phase detector 12. The phase detector 12 compares the phase of the signal at its reference frequency input 14 to the phase of the signal at its feedback frequency input 16, and generates a DC current that is a function of the difference in frequency between the feedback frequency and the reference frequency signals. The DC current flows through a first resistor 28, a variable resistor 30 and a resistor 32, in series.

The output 20 of the loop filter 18 is connected to the VCO 22 such that the value of the voltage at the output 20 of the loop filter 18 determines the frequency of the signal generated by the VCO 22. The circuit acts as a negative feedback loop that tends to minimize the difference in frequency between the reference signal and the VCO signal. When the frequency of the VCO matches the frequency of the reference signal, the negative feedback keeps the loop "locked" to this frequency.

In a prior art phase-locked loop such as the one shown in FIG. 1, various components of the circuit may experience DC voltage drift in the presence of changing temperatures, change in reference frequency, change in power of the circuit and other factors. When this occurs, it may make it difficult, or even impossible for the VCO 22 to become or remain "locked" on a reference frequency. The prior art phase-locked loop shown does not have any components or mechanisms to compensate for DC voltage drift when it does occur.

Figure 2:
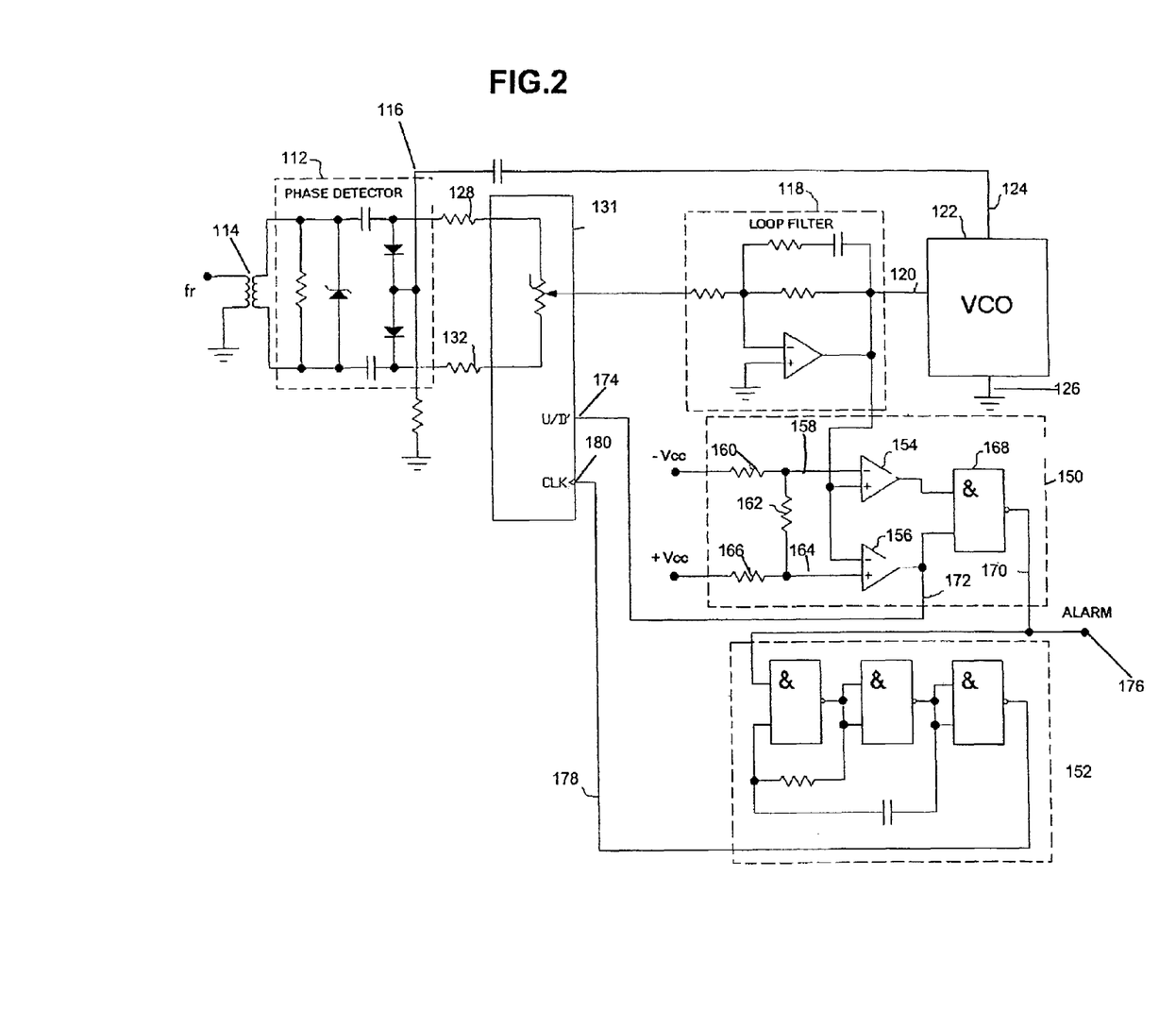
FIG. 2 is a circuit diagram of a phase-locked loop with the floating DC-offset of the present invention.

FIG. 2 shows a circuit diagram of the phase-locked loop with a floating DC-offset of the present invention. The circuit comprises the same phase-locked loop components shown in FIG. 1, except that the variable resistor 30, of the prior art has been replaced by a digital resistor 131, and the circuit includes two additional components. Components that are similar to components of the circuit shown in FIG. 1 are similarly numbered. The phase detector, loop filter, VCO and feedback branch in the circuit of the present invention operate in the same manner as described above in relation to the prior art circuit.

The additional components of the phase-locked loop circuit with a floating DC-offset of the present invention comprise a voltage comparator 150, which is coupled to the output 120 of the loop filter 118 and a clock 152 coupled to the voltage comparator 150.

The voltage comparator 150 comprises a first comparator 154 and a second comparator 156, each of which is connected to the output 120 of the loop filter 118, the first comparator 154 by its positive input, and the second comparator 156 by its negative input. The first comparator 154 is connected at its negative input to a line 158 between the second 160 and third 162 of a series of resistors connected from the power supply input to the power supply output. The second comparator 156 is connected at its positive input through a line 164 between the first 166 and second 162 of the series of resistors connected from the power supply. The first comparator 154 and the second comparator 156 are connected through their outputs to a logic gate 168, the logic gate 168 having an output 170. A second output 172 of the voltage comparator 150 is connected to the output of the second comparator 156.

The voltage comparator 150 is set to recognize a voltage designated range, the designate range being determined by the values of the three resistors 160, 162, 166 in the voltage comparator 150. The upper and lower limits of the designated range are set to fall within the limits of the voltage range at the output 120 of the loop filter 118. The designated range corresponds to a range in which the voltage at the output 120 of the loop filter 118 has a roughly proportional linear response to changes in the input voltage of the loop filter 118. The voltage comparator 150 is connected to the output 120 of the loop filter 118, and determines whether the voltage at the output 120 of the loop filter 118 is above, below, or within the designated range.

In one embodiment, the voltage comparator 150 may be set to have a narrow designated range. This prevents the phase-locked loop from locking at a harmonic or product of the reference frequency.

The voltage comparator 150 has two outputs 170, 172. The first output 170 is connected to the clock 152, and transmits a signal corresponding to whether or not the voltage at the output 118 of the loop filter 120 is outside of its designated range. The second output 172 is connected to a first input 174 of the digital resistor 131. When the voltage comparator 150 indicates that the voltage at the output 120 of the loop filter 118 is outside of its designated range, the voltage comparator 150 transmits a signal to the digital resistor 131 corresponding to whether the voltage at the output 120 of the loop filter 118 is above, or below, its designated range.

In one embodiment, the output line 170 from the voltage comparator may also connect to an alarm 176. When the voltage comparator transmits a signal indicating that the voltage at the output 120 of the loop filter 118 is out of range, the alarm 170 is triggered, signaling that the loop may soon be unable to remain, or become, locked to a reference frequency.

If the signal from the voltage comparator 150 at the line 170 connecting to the clock 152 indicates that the voltage at the output 120 of the loop filter 118 is within the designated range, the clock 152 is deactivated. If the signal from the voltage comparator 150 at the line 170 connecting to the clock 152 indicates that the voltage at the output 120 of the loop filter 118 is outside of the designated range, the clock 152 is activated. Once activated, the clock 152 emits a number of pulses at its output 178, the number of pulses corresponding to the shift in DC-offset required to bring the voltage at the output 120 of the loop filter 118 within its designated range.

The clock 152 is connected to a second input 180 of the digital resistor 131. The digital resistor 131 counts the number of pulses emitted by the clock 152. The direction in which the digital resistor 131 counts is determined by the signal received at its first input 174 from the voltage comparator 150. The resistance of the digital resistor 131 is adjusted by a discrete amount for each count, the adjustment of the resistance being determined by the direction of counting. The adjustment of the digital resistor 131 to a new resistance value results in a new DC-offset value for the circuit.

When the resistance of the digital resistor 131 has reached a level that brings the voltage at the output 120 of the loop filter 118 within its designated range, the voltage comparator 150 sends a signal through its output line 170 to the clock 152. The clock 152 is deactivated, and the digital resistor 131 stops counting. The digital resistor 131 maintains its new resistance, and the circuit maintains its new DC-offset value.

Figure 3:
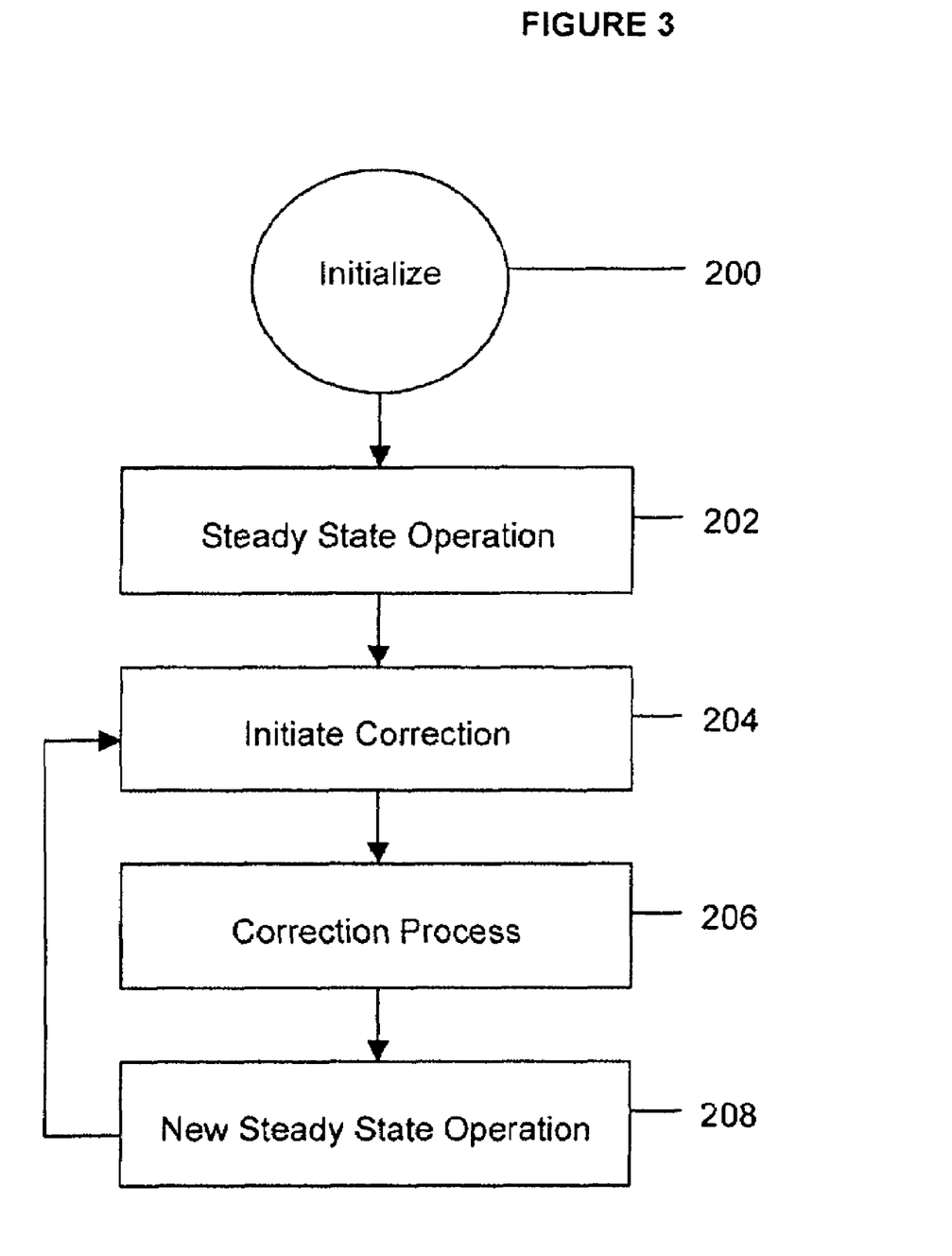
FIG. 3 is a schematic diagram of the method of operation of the circuit of the present invention.

FIG. 3 is a schematic diagram showing the method of operation of the circuit of the present invention. The first step, at Step 200, is the initialization of the circuit. The circuit is turned on, which activates the clock. The clock emits impulses that are detected by the digital resistor, and the digital resistor counts in a positive direction, which in turn raises the resistance of the digital resistor, raising the voltage at the output of the phase detector. This continues until the voltage at the output of the loop filter reaches the designated range set by the voltage comparator.

Once the circuit has been initialized, at Step 202, the clock is deactivated, and the circuit runs at a steady state as a standard phase-locked loop with the phase detector at the DC-offset reached at the end of Step 200.

If the voltage comparator detects that the voltage at the output of the loop filter has gone out of range, at Step 204, the voltage comparator activates the clock, which initiates the correction process.

At Step 206, the circuit runs its correction process. The clock is activated, and emits impulses, which are detected by the digital resistor. The digital resistor starts counting the clock impulses in an up or down, in the direction dictated by the direction signal the digital resistor receives from the voltage comparator. The increase or decrease of the resistance of the digital resistor continues until the voltage at the output line of the loop filter returns to its designated range.

At Step 208, the voltage at the output line of the loop filter has been returned to its designated range. The circuit runs at a steady state as a standard phase-locked loop with the digital resistor at the new resistance reached at the end of Step 206. The circuit remains in this steady state until the voltage at the output of the loop filter goes out of the designated range, which returns the circuit to Step 204.

Figure 4:
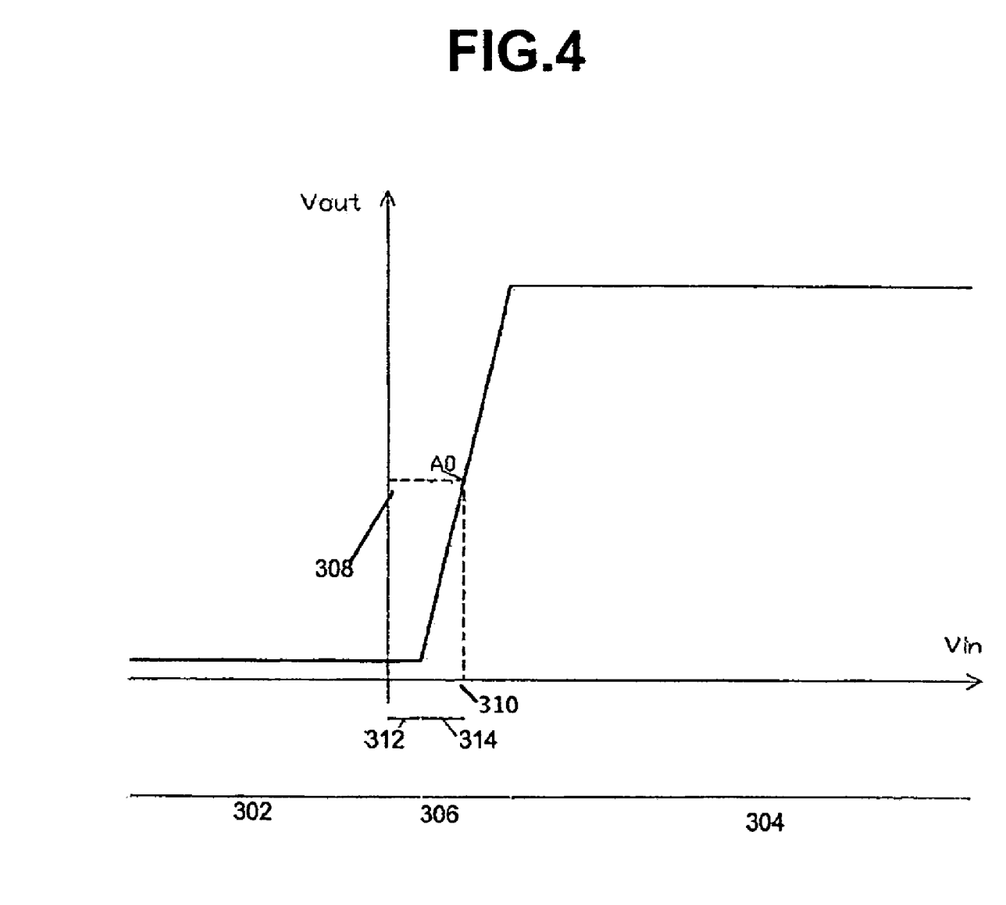
FIG. 4 is a graphical representation of the behaviour of the output voltage of the loop filter as a function of the input voltage of the loop filter in a prior art phase-locked loop.

FIG. 4 is a graphical representation of the relationship between the input voltage (Vin), of the loop filter and the output voltage (Vout), at the output of the loop filter in a standard phase-locked loop without the floating DC-offset of the present invention. Vin is the sum of the offset voltage (Voffset), and the error voltage (Verror). Verror corresponds to the DC signal at the output of the phase detector, relating to the difference in phase between the signal produced by the VCO and the reference phase. The graph shows the behaviour of Vout as a function of Vin.

The graph can be divided along the x-axis into a first ineffective voltage range 302 and a second ineffective voltage range 304 and one effective voltage range 306. The first ineffective voltage range 302 and the second ineffective voltage range 304 are ranges of values of Vin for which Vout shows little or no response to changes in Vin. In the first ineffective voltage range 302, Vout is at its minimum value, and in the second ineffective voltage range 304, Vout is at its maximum value. The effective voltage range 306 is a range of values of Vin for which Vout shows a generally linear proportional response to changes in Vin. When Vin is within the effective voltage range 306, the circuit functions effectively as a phase-locked loop that is able to remain locked or become locked to a reference frequency.

Point A0 represents the value of Vout 308 for a given value of Vin 310. The given value of Vin 310 is equal to the sum of the Voffset 312 of the system and a given Verror 314. So long as the sum of Voffset 312 and Verror 314 remains within the effective voltage range 306, the phase-locked loop will behave effectively to remain or become locked to a reference frequency. However, if Voffset 312 changes, as a result of temperature, power supply, RF level variation, or other factors, the value of Vin 310 may move into the first ineffective voltage range 302 or the second ineffective voltage range 304, in which Vout will no longer respond to changes in Vin. Once Vout is no longer responding to Vin it becomes difficult for the circuit to become, or remain, locked to a reference frequency.

Figure 5:
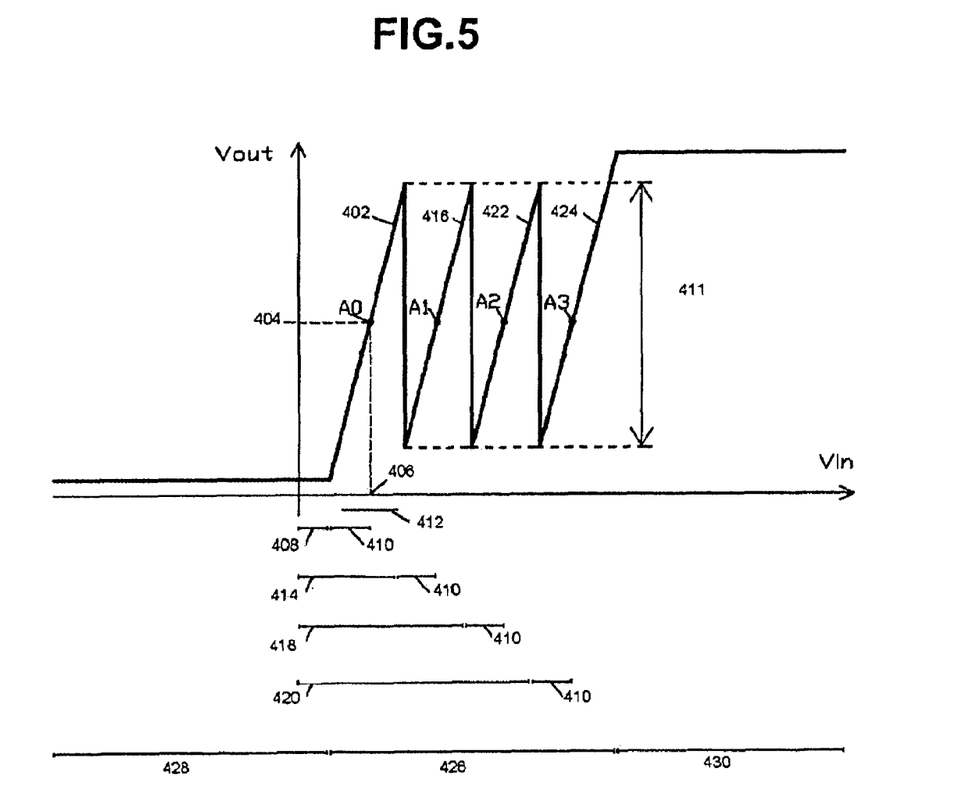
FIG. 5 is a graphical representation of the behaviour of the output voltage of the loop filter as a function of the input voltage of the loop filter in a phase-locked loop with the floating DC-offset of the present invention.

FIG. 5 is a graphical representation of the relationship between the input voltage, Vin, of the loop filter and the voltage at the output of the loop filter, Vout, in a phase-locked loop with a floating DC-offset according to the present invention.

The graph shows a series of curves. The first curve 402 is identical to the curve shown in FIG. 4. Point A0 represents the value of Vout 404 for a given value of Vin 406, where Vin is the sum of a given value of Voffset 408 and a given value of Verror 410.

According to this invention, if Voffset 408 changes to an extent that Vin is approaching the end of the effective voltage range 412 for the first curve 402, and Vout has reached the limit of the designated range 411 determined by the values of the three resistors 160, 162, 166 in the voltage comparator 150, the circuit is automatically adjusted. For example, the circuit can adjust as described in the paragraphs above to have a new, second value of Voffset 414, corresponding to a second curve 416. On this second curve, the value of Verror 410 does not change, and the corresponding value of Vout 404 indicated by point A1 also does not change. Only the value of Voffset 414 is new.

In a similar fashion, the circuit may also adjust the Voffset to a third value of Voffset 418 and a fourth value of Voffset 420, corresponding to a third curve 422 and a fourth curve 424. At each of these curves, the value of Vout 404 corresponding to a given Verror 410 remains the same, as indicated by points A2 and A3.

As a result of the circuit's ability to change the value of Voffset without changing the value of Vout 404 corresponding to a given Verror 410, the effective voltage range 426 of the circuit of the present invention is significantly larger than the effective voltage range of a standard phase-locked loop without a floating DC-offset. This means that the circuit can be exposed to more extreme environmental factors, such as temperature, power supply or RF level variation before Vin enters a first ineffective voltage range 428 or a second ineffective voltage range 430 in which Vout no longer responds to changes in Vin. The phase-locked loop with floating DC-offset is able to remain, or become, locked to a reference frequency under more extreme conditions than a standard phase-locked loop without floating DC-offset.

Figure 6:
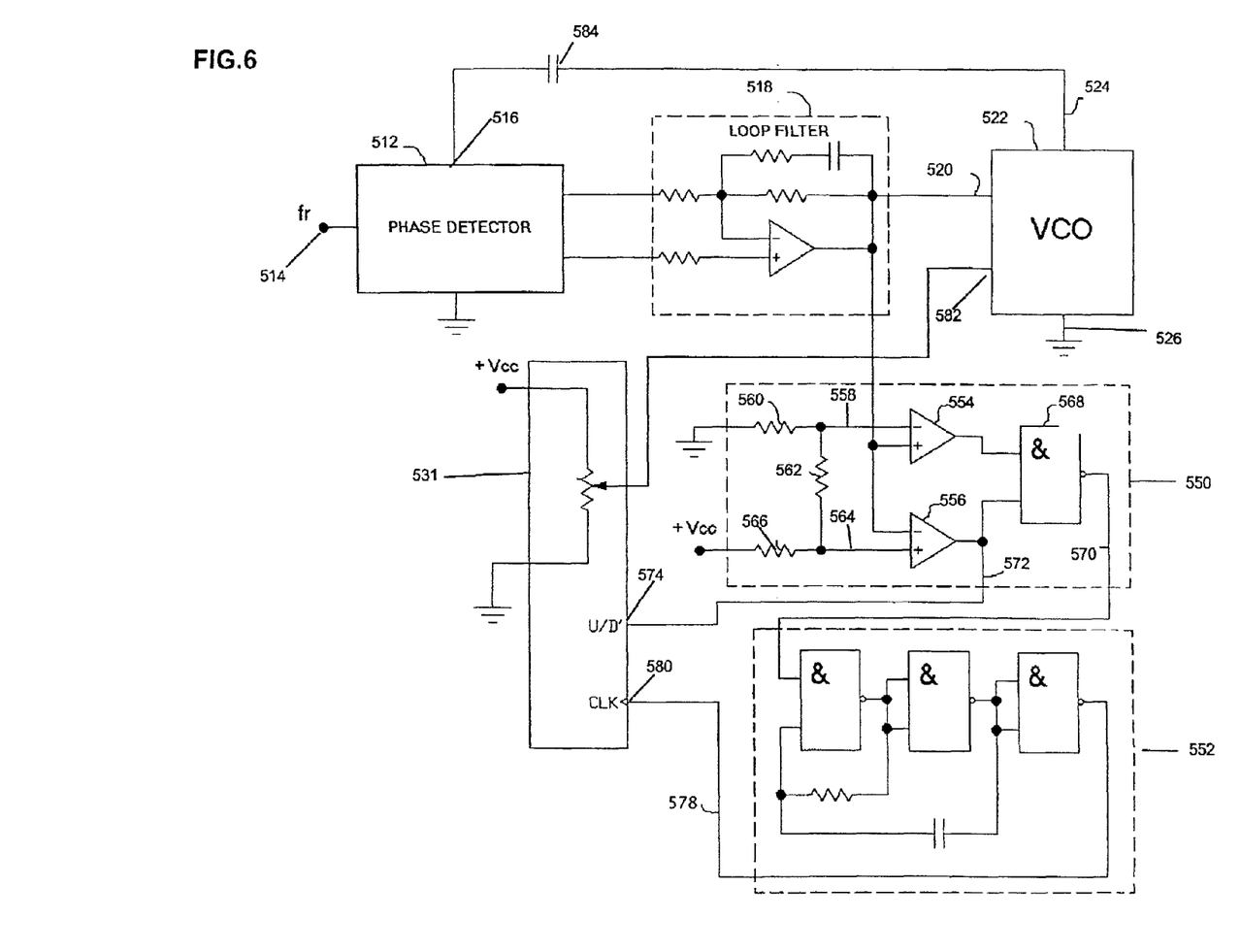
FIG. 6 is a circuit diagram of an alternate embodiment of a phase-locked loop circuit of the present invention.

FIG. 6 shows a circuit diagram that illustrates an alternate embodiment of the invention, in which voltage drift of a wide-tuned VCO 522 in a phase-locked loop is compensated while keeping the loop locked to a reference frequency. The circuit comprises the components of the phase-locked loop components shown in FIG. 2, with some modifications in the connections between the components, and with the addition of one new component. Components that are similar in structure and function to the components of FIGS. 1 and 2 are similarly numbered.

In the alternative embodiment shown in FIG. 6, the output of the phase detector 512 is not connected to the digital resistor 531. Instead the output of the phase detector is 512 is connected directly to the loop filter 518. The output of the digital resistor 531 is not connected to the loop filter 518, but is instead connected to a rough-tuning input 582 of the VCO 522. In addition, the alternate embodiment comprises a capacitor 584 in the VCO feedback line 524. The phase detector 512, loop filter 518, VCO 522 and feedback branch 524 in the circuit of the present invention operate in the same manner as described above in relation to the prior art circuit The voltage comparator 550 comprises a first comparator 554 and a second comparator 556, each of which is connected to the output 520 of the loop filter 518, the first comparator 554 by its positive input, and the second comparator 556 by its negative input. The first comparator 554 is connected at its negative input to a line 558 between the second 560 and third 562 of a series of resistors connected from the power supply input to the power supply output. The second comparator 556 is connected at its positive input through a line 564 between the first 566 and second 562 of the series of resistors connected from the power supply. The first comparator 554 and the second comparator 556 are connected through their outputs to a logic gate 568, the logic gate 568 having an output 570. A second output 572 of the voltage comparator 550 is connected to the output of the second comparator 556.

The voltage comparator 550 is set to recognize a voltage designated range, the designated range being determined by the values of the three resistors 560, 562, 566 in the voltage comparator 550. The upper and lower limits of the designated range are set to fall within the limits of the voltage range at the output 520 of the loop filter 518. The designated range corresponds to a range in which the voltage at the output 520 of the loop filter 518 has a roughly proportional linear response to changes in the input voltage of the loop filter 518. The voltage comparator 550 is connected to the output 520 of the loop filter 518, and determines whether the voltage at the output 518 of the loop filter 518 is above, below, or within the designated range.

In one embodiment, the voltage comparator 550 may be set to have a narrow designated range. This prevents the phase-locked loop from locking at a harmonic or product of the reference frequency.

The voltage comparator 550 has two outputs 570, 572. The first output 570 is connected to the clock 552, and transmits a signal corresponding to whether or not the voltage at the output 520 of the loop filter 518 is outside of its designated range. The second output 572 is connected to a first input 574 of the digital resistor 531. When the voltage comparator 550 indicates that the voltage at the output 520 of the loop filter 518 is outside of its designated range, the voltage comparator 550 transmits a signal to the digital resistor 531 corresponding to whether the voltage at the output 520 of the loop filter 518 is above, or below, its designated range.

In one embodiment, the output line 570 from the voltage comparator may also connect to an alarm (not shown). When the voltage comparator transmits a signal indicating that the voltage at the output 520 of the loop filter 518 is out of range, the alarm (not shown) is triggered, signaling that the loop may soon be unable to remain, or become, locked to a reference frequency.

If the signal from the voltage comparator 550 at the line 570 connecting to the clock 552 indicates that the voltage at the output 520 of the loop filter 518 is within the designated range, the clock 552 is deactivated. If the signal from the voltage comparator 550 at the line 570 connecting to the clock 552 indicates that the voltage at the output 520 of the loop filter 518 is outside of the designated range, the clock 552 is activated. Once activated, the clock 552 emits a number of pulses at its output 578, the number of pulses corresponding to the shift in DC-offset required to bring the voltage at the output 520 of the loop filter 518 within its designated range.

The clock 552 is connected to a second input 580 of the digital resistor 531. The digital resistor 531 counts the number of pulses emitted by the clock 552. The direction in which the digital resistor 531 counts is determined by the signal received at its first input 574 from the voltage comparator 550. The resistance of the digital resistor 531 is adjusted by a discrete amount for each count, the direction of adjustment of the resistance being determined by the direction of counting. The adjustment of the digital resistor 531 to a new resistance value adjusts the rough-tuning input of the VCO 522.

When the resistance of the digital resistor 531 has reached a level that brings the voltage at the output 520 of the loop filter 518 within its designated range, the voltage comparator 550 sends a signal through its output line 570 to the clock 552. The clock 552 is deactivated, and the digital resistor 531 stops counting and maintains its new resistance.

The digital resistor 531 is set to have an output voltage range that is the full band of the VCO 522. The feedback signal acts to compensate a voltage drift in the VCO 522 caused by changes in temperature, power supply or other factors. In turn, this enables the phase-locked loop to remain, or become, locked to a reference frequency in a range of external conditions.

Figure 7:
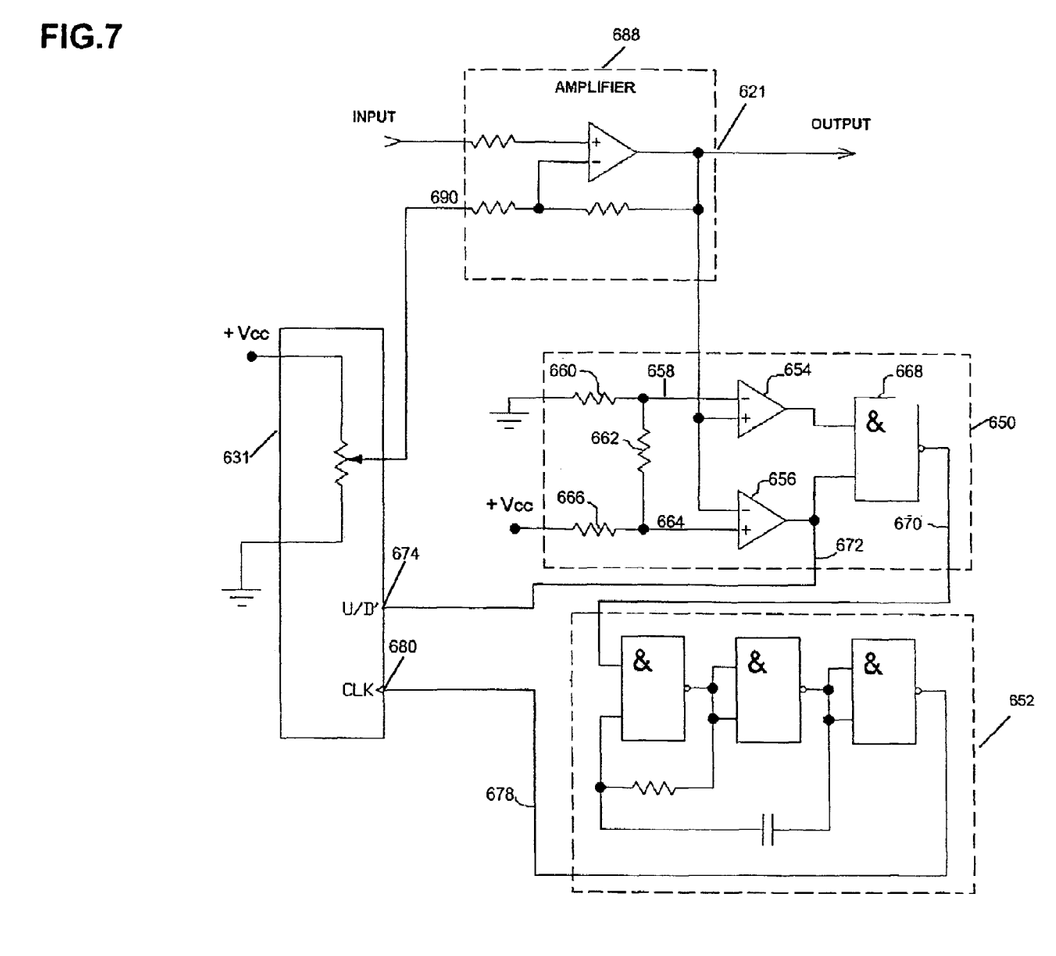
FIG. 7 is a circuit diagram of an embodiment of a floating offset amplifier circuit of the present invention.

FIG. 7 shows a circuit diagram that illustrates an alternate embodiment of the invention, in which input voltage drift of an amplifier 688 is offset. In addition to the amplifier 688, the circuit includes three additional components. The additional components of the amplifier circuit with a floating DC-offset of the present invention comprise a voltage comparator 650, which is coupled to the output 621 of the amplifier 688, a clock 652 coupled to the voltage comparator 650, and a digital resistor 631 connected to an output 672 of the voltage comparator 650 and an output 678 of the clock 652, and with an output of the digital resistor 631 connected to an offset input 690 of the amplifier 688.

The voltage comparator 650 comprises a first comparator 654 and a second comparator 656, each of which is connected to the output 621 of the amplifier 688, the first comparator 654 by its positive input, and the second comparator 656 by its negative input. The first comparator 654 is connected at its negative input to a line 658 between the second 660 and third 662 of a series of resistors connected from the power supply input to the power supply output. The second comparator 656 is connected at its positive input through a line 664 between the first 666 and second 662 of the series of resistors connected from the power supply. The first comparator 654 and the second comparator 656 are connected through their outputs to a logic gate 668, the logic gate 668 having an output 670. A second output 672 of the voltage comparator 650 is connected to the output of the second comparator 656.

The voltage comparator 650 is set to recognize a voltage designated range, the designated range being determined by the values of the three resistors 660, 662, 666 in the voltage comparator 650. The upper and lower limits of the designated range are set to fall within the limits of the voltage range at the output 621 of the amplifier 688. The designated range corresponds to a range in which the voltage at the output 621 of the amplifier 688 has a roughly proportional linear response to changes in the offset input voltage of the amplifier 688. The voltage comparator 650 is connected to the output 621 of the amplifier 688, and determines whether the voltage at the output 621 of the amplifier 688 is above, below, or within the designated range.

The voltage comparator 650 has two outputs 670, 672. The first output 670 is connected to the clock 652, and transmits a signal corresponding to whether or not the voltage at the output 621 of the amplifier 688 is outside of its designated range. The second output 672 is connected to a first input 674 of the digital resistor 631. When the voltage comparator 650 indicates that the voltage at the output 621 of the amplifier 688 is outside of its designated range, the voltage comparator 650 transmits a signal to the digital resistor 631 corresponding to whether the voltage at the output 621 of the amplifier 688 is above, or below, its designated range.

In one embodiment, the output line 670 from the voltage comparator may also connect to an alarm (not shown). When the voltage comparator transmits a signal indicating that the voltage at the output 621 of the amplifier 688 is out of range, the alarm (not shown) is triggered.

If the signal from the voltage comparator 650 at the line 670 connecting to the clock 652 indicates that the voltage at the output 621 of the amplifier 688 is within the designated range, the clock 652 is deactivated. If the signal from the voltage comparator 650 at the line 670 connecting to the clock 652 indicates that the voltage at the output 621 of the amplifier 688 is outside of the designated range, the clock 652 is activated. Once activated, the clock 652 emits a number of pulses at its output 678, the number of pulses corresponding to the shift in DC-offset required to bring the voltage at the output 621 of the amplifier 688 within its designated range.

The clock 652 is connected to a second input 680 of the digital resistor 631. The digital resistor 631 counts the number of pulses emitted by the clock 652. The direction in which the digital resistor 631 counts is determined by the signal received at its first input 674 from the voltage comparator 650. The resistance of the digital resistor 631 is adjusted by a discrete amount for each count, the direction of adjustment of the resistance being determined by the direction of counting. The adjustment of the digital resistor 631 to a new resistance value adjusts the voltage at a second offset input 690 of the amplifier 688.

When the voltage at the second offset input 690 of the amplifier 688 has reached a level that brings the voltage at the output 621 of the amplifier 688 within its designated range, the voltage comparator 650 sends a signal through its output line 670 to the clock 652. The clock 652 is deactivated, and the digital resistor 631 stops counting and maintains its new stage, which holds the voltage at the second offset input 690 of the amplifier 688 constant.

Figure 8:
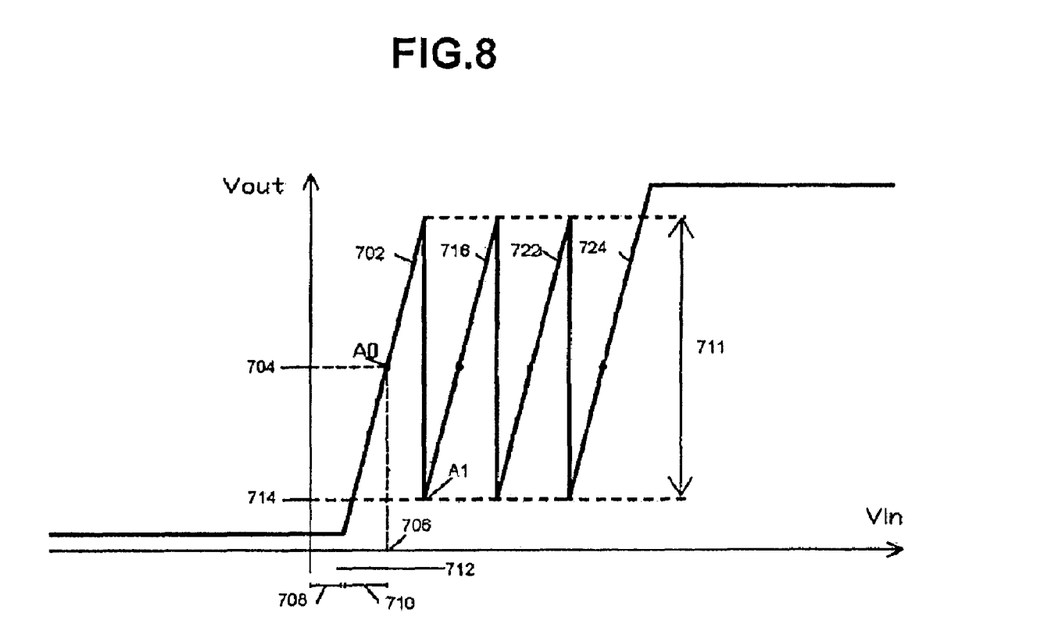
FIG. 8 is a graphical representation of the behaviour of the output voltage of the amplifier as a function of the input voltage of an amplifier circuit of the present invention.

FIG. 8 is a graphical representation of the relationship between the input voltage, Vin, of the amplifier 688 and the voltage at the output of the amplifier, Vout, with a floating DC-offset according to the present invention.

The graph shows a series of curves similar to the curves shown in FIG. 5. The first curve 702 is identical to the curve shown in FIG. 4. Point A0 represents the value of Vout 704 for a given value of Vin 706, where Vin is the sum of Voffset 708 and Verror 710.

According to this invention, if Voffset 708 changes to an extent that Vin is approaching the end of the effective voltage range 712 for the first curve 702, and Vout has reached the limit of the designated range 711 determined by the values of the three resistors 660, 662, 666 in the voltage comparator 650, the circuit is automatically adjusted. For example, the circuit can adjust as described in the paragraphs above to have a new, second value of Vout 714, shown at point A1, corresponding to a second curve 716.

Unlike the value of Vout in the graph shown in FIG. 5, which corresponds to a phase-locked loop, in the absence of a loop, on this second curve 716, although the value of Vin changes only marginally to trigger the shift in curve, the corresponding value of Vout 714 indicated by point A1 does change significantly. If the value of Vout is rising on the first curve 702, when the value reaches the upper limit of the designated range 711, the circuit shifts to the second curve 716, and the value of Vout shifts to the lower limit of the designate range. If the value of Vin continues to rise, the value of Vout rises proportionally along the second curve 716. In a similar fashion, the circuit may also adjust to a third curve 722 and a fourth curve 724 or may adjust in the opposite direction when Vin is dropping.

Figure 9:
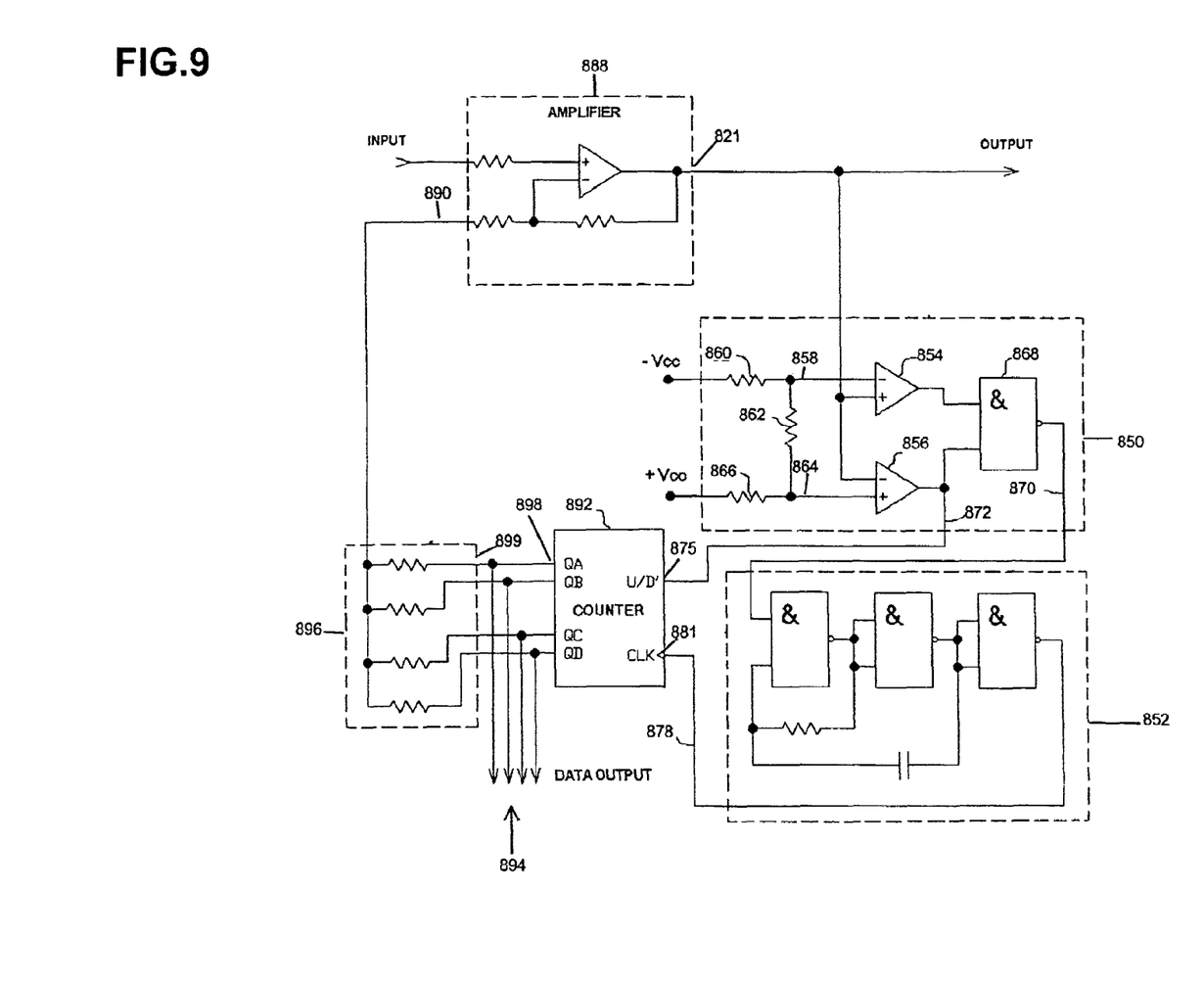
FIG. 9 is a circuit diagram of an alternate embodiment of a floating offset amplifier circuit of the present invention.

FIG. 9 shows a circuit diagram of an alternative embodiment of the amplifier with a floating DC-offset of the present invention. The circuit comprises most of the DC-offset amplifier components shown in FIG. 7, but the circuit includes additional components. Components that are similar to components of the circuit shown in FIG. 7 are similarly numbered. The amplifier 888, voltage comparator 850, and clock 852 in the circuit of the present invention operate in the same manner as described above in relation to the prior art circuit.

The additional components of the amplifier circuit with a floating DC-offset of the present invention comprise a digital counter 892, which is coupled to outputs of the voltage comparator 850 and clock 852, a data output 894, which is coupled to the outputs 898 of the digital counter 892, and an analog-to-digital converter 896, which is coupled to the outputs 898 of the digital counter 892, and is coupled through its output to a second offset input 890 of the amplifier 888.

The voltage comparator 850 comprises a first comparator 854 and a second comparator 856, each of which is connected to the output 821 of the amplifier 888, the first comparator 854 by its positive input, and the second comparator 856 by its negative input. The first comparator 854 is connected at its negative input to a line 858 between the second 860 and third 862 of a series of resistors connected from the power supply input to the power supply output. The second comparator 856 is connected at its positive input through a line 864 between the first 866 and second 862 of the series of resistors connected from the power supply. The first comparator 854 and the second comparator 856 are connected through their outputs to a logic gate 868, the logic gate 868 having an output 870. A second output 872 of the voltage comparator 850 is connected to the output of the second comparator 856.

The voltage comparator 850 is set to recognize a voltage designated range, the designated range being determined by the values of the three resistors 860, 862, 866 in the voltage comparator 850. The upper and lower limits of the designated range are set to fall within the limits of the voltage range at the output 821 of the amplifier 888. The designated range corresponds to a range in which the voltage at the output 821 of the amplifier 888 has a roughly proportional linear response to changes in the input voltage of the amplifier 888. The voltage comparator 850 is connected to the output 821 of the amplifier 888, and determines whether the voltage at the output 821 of the amplifier 888 is above, below, or within the designated range.

The voltage comparator 850 has two outputs 870, 872. The first output 870 is connected to the clock 852, and transmits a signal corresponding to whether or not the voltage at the output 821 of the amplifier 888 is outside of its designated range. The second output 872 is connected to a first input 875 of the digital counter 892. When the voltage comparator 850 indicates that the voltage at the output 821 of the amplifier 888 is outside of its designated range, the voltage comparator 850 transmits a signal to the digital counter 892 corresponding to whether the voltage at the output 821 of the amplifier 888 is above, or below, its designated range.

In one embodiment, the output line 870 from the voltage comparator may also connect to an alarm (not shown). When the voltage comparator transmits a signal indicating that the voltage at the output 821 of the amplifier 888 is out of range, the alarm (not shown) is triggered.

If the signal from the voltage comparator 850 at the line 870 connecting to the clock 852 indicates that the voltage at the output 821 of the amplifier 888 is within the designated range, the clock 852 is deactivated. If the signal from the voltage comparator 850 at the line 870 connecting to the clock 852 indicates that the voltage at the output 821 of the amplifier 888 is outside of the designated range, the clock 852 is activated. Once activated, the clock 852 emits a number of pulses at its output 878, the number of pulses corresponding to the shift in DC-offset required to bring the voltage at the output 821 of the amplifier 888 within its designated range.

The clock 852 is connected to a second input 881 of the digital counter 892. The digital counter 892 counts the number of pulses emitted by the clock 852. The direction in which the digital counter 892 counts is determined by the signal received at its first input 875 from the voltage comparator 850. The outputs 898 of the digital counter 892 are connected to the digital-to-analog converter 896. The digital-to-analog converter 896 converts the digital signal from the digital counter 892 to an analog signal. The signal is transmitted to the second offset input 890 of the amplifier 888.

When the voltage at the second offset input 890 of the amplifier 888 has reached a level that brings the voltage at the output 821 of the amplifier 888 within its designated range, the voltage comparator 850 sends a signal through its output line 870 to the clock 852. The clock 852 is deactivated, and the digital counter 892 stops counting and maintains its new stage, which holds the voltage at the second offset input 890 of the amplifier 888 constant. The data outputs 894 of the digital counter 892 allow the recording of data representing the new DC-offset value of the circuit.

The invention claimed is:

1. A floating DC-offset circuit electronically connected to components of a standard phase-locked loop circuit, the standard phase-locked loop comprising:
   a phase detector;
   a loop filter; and
   a voltage-controlled oscillator,
   wherein the phase detector, loop filter and voltage-controlled oscillator are connected in series in a loop configuration,
   the floating DC-offset circuit comprising:
      a voltage comparator electronically connected to the output of the loop filter;
      clock circuit receiving an output of the voltage comparator; and,
      a digital resistor connected to outputs of both the voltage comparator and the clock circuit, the digital resistor connected to the phase detector.

2. The floating DC-offset circuit of claim 1, wherein the circuit further comprises an alarm branch coupled to one output of the voltage comparator.

3. A method of applying a floating DC-offset to a phase-locked loop, the loop comprising a phase detector, loop filter and voltage-controlled oscillator connected in series in a loop configuration, the method comprising the steps of:
   setting a designated range at a voltage comparator, the voltage comparator being connected to the output of the loop filter, the designated range having an upper limit lower than the highest voltage at the output of the loop filter, the lower limit higher than the lowest voltage at the output of the loop filter;
   setting the voltage comparator to output one of three signals, the signals being:
   loop filter output voltage is above the designated range, loop filter output voltage is below the designated range, and loop filter output voltage is within the designated range;
   detecting the output signal of the voltage comparator at a clock;
   activating the clock if the voltage comparator outputs a signal that the loop filter output voltage is above or below the designated range;
   detecting, at a digital resistor, clock pulses from an output of the clock, detecting a direction signal from the voltage comparator, and shifting the resistance of the digital resistor, shifting the DC-offset at the phase detector in the phase-locked loop according to the direction signal from the voltage comparator;
   deactivating the clock when the voltage comparator indicates that the output voltage is within the designated range; and
   maintaining the new DC-offset value at the phase detector when the clock stops.

4. The method of claim 3, further comprising setting the designated range to a narrow band to prevent the voltage-controlled oscillator from operating at a harmonic or a multiple of the phase-locked loop's reference frequency.

5. A floating DC-offset circuit electronically connected to components of a standard phase-locked loop circuit, the standard phase-locked loop comprising:
   a phase detector;
   a loop filter; and
   a wide-band voltage-controlled oscillator, the wide-band voltage-controlled oscillator being connected at a first input to the output of the loop filter,
   wherein the phase detector, loop filter and voltage-controlled oscillator are connected in series in a loop configuration,
   the floating DC-offset circuit comprising:
      a voltage comparator electronically connected to the output of the loop filter;
      a clock circuit receiving an output of the voltage comparator;
      a digital resistor connected to outputs of both the voltage comparator and the clock circuit; the digital resistor being connected to a second input of the wide-band voltage-controlled oscillator.

6. A method of applying a floating DC-offset to a phase-locked loop, the loop comprising a phase detector, loop filter and a first input of a voltage-controlled oscillator connected in series in a loon configuration, the method comprising the steps of:

setting a designated range at a voltage comparator, the voltage comparator being connected to the output of the loop filter and the first input of the voltage-controlled oscillator, the designated range having an upper limit lower than the highest voltage at the output of the loop filter, the lower limit higher than the lowest voltage at the output of the loop filter;

setting the voltage comparator to output one of three signals, the signals being:

loop filter output voltage is above the designated range, loop filter output voltage is below the designated range, and loop filter output voltage is within the designated range;

detecting the output signal of the voltage comparator at a clock;

activating the clock if the voltage comparator emits a signal that the loop filter output voltage is above or below the designated range;

detecting, at a digital resistor, clock pulses from an output of the clock, detecting a direction signal from the voltage comparator, counting the number of clock pulses in the direction provided by the voltage comparator and adjusting the DC-offset at a second input of the voltage-controlled oscillator according to the output of the digital resistor;

deactivating the clock when the voltage comparator indicates that the output voltage is within the designated range; and maintaining the new DC-offset value at the second input of the voltage-controlled oscillator when the clock is deactivated.

7. The method of claim 6, further comprising setting the designated range to a narrow band to prevent the voltage-controlled oscillator from operating at a harmonic or a multiple of the phase-locked loop's reference frequency.

* * * * *